United States Patent
Segala

(10) Patent No.: US 6,778,397 B2
(45) Date of Patent: Aug. 17, 2004

(54) HEAT DISSIPATER FOR INTEGRATED CIRCUITS

(75) Inventor: Marco Segala, Mantova (IT)

(73) Assignee: Spark Electronic S.r.l., San Giorgio di Mantova (IT)

( * ) Notice: Subject to any disclaimer, the term of this patent is extended or adjusted under 35 U.S.C. 154(b) by 0 days.

(21) Appl. No.: 10/373,788

(22) Filed: Feb. 27, 2003

(65) Prior Publication Data

US 2003/0161107 A1 Aug. 28, 2003

(30) Foreign Application Priority Data

Feb. 27, 2002 (EP) .............................. 02425108

(51) Int. Cl.$^7$ .......................... H05K 7/20; H01L 23/36; H01L 23/40

(52) U.S. Cl. ...................... 361/719; 361/702; 361/710; 361/718; 257/718; 257/719

(58) Field of Search ................................ 361/702–704, 361/709–712, 717–719; 257/705–707, 713–720; 174/16.3

(56) References Cited

U.S. PATENT DOCUMENTS

| | | | | |
|---|---|---|---|---|
| 4,587,595 A | * | 5/1986 | Staples | ........................ 361/170 |
| 4,594,643 A | | 6/1986 | Hermann | |
| 4,679,118 A | * | 7/1987 | Johnson et al. | ............. 361/718 |
| 4,857,595 A | | 8/1989 | Kazmierzak et al. | |
| 5,240,429 A | | 8/1993 | Myers | |
| 5,251,101 A | * | 10/1993 | Liu | ............................ 361/717 |
| 5,299,632 A | * | 4/1994 | Lee | ........................... 165/80.3 |
| 5,313,099 A | | 5/1994 | Tata et al. | |
| 5,357,404 A | * | 10/1994 | Bright et al. | ................ 361/818 |
| 5,396,402 A | | 3/1995 | Perugini et al. | |
| 5,397,919 A | | 3/1995 | Tata et al. | |
| 5,667,870 A | | 9/1997 | McCullough | |
| 5,724,228 A | * | 3/1998 | Lee | ............................. 361/697 |
| 5,774,335 A | | 6/1998 | Pare et al. | |
| 5,784,257 A | | 7/1998 | Tata | |
| 5,818,695 A | | 10/1998 | Olson | |
| 5,825,622 A | | 10/1998 | Rife et al. | |
| 5,847,928 A | * | 12/1998 | Hinshaw et al. | ............. 361/704 |
| 5,893,409 A | * | 4/1999 | Kohler et al. | ............... 165/80.3 |
| 5,945,736 A | | 8/1999 | Rife et al. | |
| 6,014,315 A | | 1/2000 | McCullough et al. | |
| 6,021,045 A | | 2/2000 | Johnson | |
| 6,055,159 A | | 4/2000 | Sun | |
| 6,061,240 A | | 5/2000 | Butterbaugh et al. | |
| 6,075,699 A | | 6/2000 | Rife | |
| 6,093,961 A | | 7/2000 | McCullough | |
| 6,191,478 B1 | * | 2/2001 | Chen | ........................... 257/718 |
| 6,201,697 B1 | | 3/2001 | McCullough | |
| 6,252,774 B1 | | 6/2001 | Rife | |
| 6,275,380 B1 | * | 8/2001 | Bollesen | ...................... 361/704 |
| 6,304,449 B1 | * | 10/2001 | Zhang | ......................... 361/704 |

FOREIGN PATENT DOCUMENTS

| | | |
|---|---|---|
| DE | 43 35 299 A1 | 4/1995 |
| EP | 0 777 270 A1 | 6/1997 |
| GB | 2 312 986 | 12/1997 |

* cited by examiner

*Primary Examiner*—Antatoly Vortman
(74) *Attorney, Agent, or Firm*—Browdy and Neimark, P.L.L.C.

(57) ABSTRACT

Heat dissipater for integrated circuits comprising a dispersion element able to be associated to an integrated circuit, through securing means constituted by two locking elements mounted on the dispersion element in mutually opposite positions. The locking elements have each a latching pin and are able to slide laterally to the dispersion element from a lower position in which the pins are inferiorly distanced from the base and form between them a passage for the coupling of the dissipater on an integrated circuit, to an upper position in which the pins are proximate to the base and are mutually approached. The dissipater further comprises elastic means interposed between the dispersion element and the locking elements to thrust them towards the upper position.

21 Claims, 2 Drawing Sheets

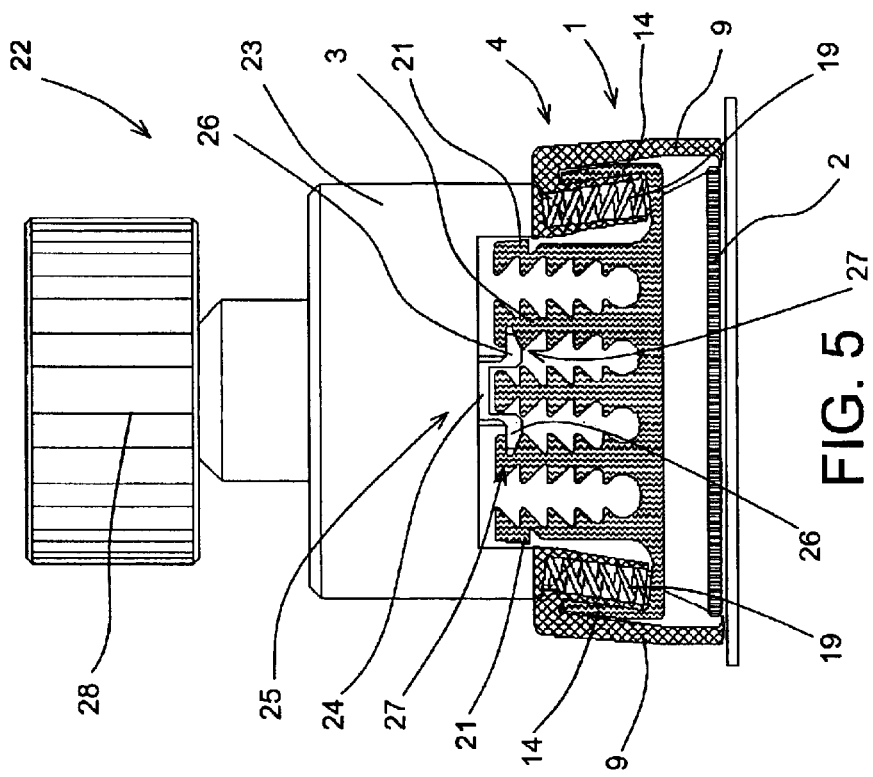
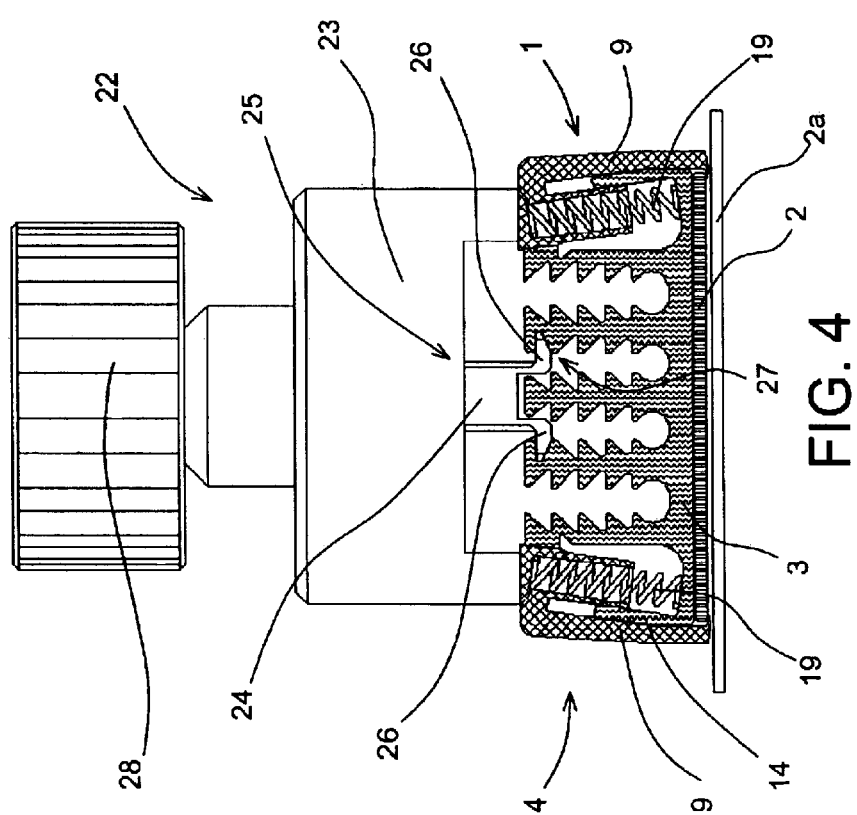

HEAT DISSIPATER FOR INTEGRATED CIRCUITS

BACKGROUND OF THE INVENTION

The present invention relates to a heat dissipater for integrated circuits.

Over the past few years, the ever greater development of the potential of integrated circuits has led, in parallel, to the need to have available appropriate means for their cooling, due to the considerable amount of heat that is generated therein.

A feature shared by all heat dissipation devices known to date is that of comprising a dispersion element made of a conducting material that is brought into contact with the upper surface of the integrated circuit. The thermal contact may be accentuated by means of appropriate heat-conducting pastes, which are interposed between the integrated circuit and the dispersion element.

Additionally, to the upper part of the dispersion element can be associated a fan to enhance heat exchange.

Over time, quite a number of systems for coupling the dispersion elements to the integrated circuits have been developed.

A first type of design, described in many variations for instance in the Patents U.S. Pat. Nos. 5,313,099, 5,397,919, 5,667,870, 5,825,622, 5,774,335, 6,014,315, 5,945,736, 6,021,045, 6,075,699, and 6,252,774, provides for the dissipater to be constituted by a support that is fixed relative to the integrated circuit, and by a dispersion element with cylindrical base that is screwed in an appropriate seat obtained in the support in correspondence with the upper surface of the integrated circuit.

The support can be fastened either directly on the integrated circuit, by means of a pressure coupling or of a lateral sliding of the support on the integrated circuit itself, or using appropriate holes or supports obtained in the board whereon the integrated circuit is mounted.

This first dissipater design type, however, has a series of drawbacks.

In particular, dissipaters built as described above have a limited dispersion power, because they do not allow to obtain the thermal contact between the dispersion element and the integrated circuit over the entire surface of the circuit, because of the cylindrical shape of the base of the dispersion element. An additional drawback is constituted by the fact that the pressure exerted by the dispersion element against the integrated circuit depends on how far the assigned operator screws the dispersion element itself on the support.

It should be kept in mind that the amount of tightening must be appropriately calibrated, because an insufficient tightening compromise conduction between the two, whilst an excessive tightening can lead to the warping of the integrated circuit.

A second heat dissipater design type provides for the dispersion element to have a rectangular base surface corresponding to the upper surface of the integrated circuit, whereto it is fastened by means of appropriate mounting clips or mounting hooks.

The mounting clips are fastened inferiorly either to the integrated circuit or to the circuit whereon it is mounted, at the two sides of the dispersion element, and they press it downwards from above.

The pressure of the clip against the dispersion element can be effected by means of a thrust element screwed into the clip itself, as described for instance in the U.S. Pat. Nos. 5,784,257 and 5,774,335, by means of a manually operated cam as described for instance in the U.S. Pat. No. 6,201,697, by means of appropriate springs as disclosed for instance in the Patent GB 2312986, or by means of an elastic action of the clip itself as described for instance in the U.S. Pat. Nos. 4,857,595, 5,818,695.

In regard to the hooks, they fasten in different points (for instance in the four corners) the dispersion element either to the board or to the integrated circuit, and they are occasionally aided by thrust means (springs or screws) which press the dispersion element against the integrated circuit, as described for instance in the U.S. Pat. Nos. 6,061,240 and 6,055,159.

The main drawback of this second dissipater design type consists of the difficulties encountered during the mounting phase, when the installer has a plurality of distinct pieces to be applied simultaneously.

This drawback is accentuated by the fact that oftentimes the integrated circuits that require cooling (such as microprocessors) are mounted on the related boards with very little space between the various components, so that there is hardly any room to manoeuvre.

If the pressure on the dispersion element is effected by means of screwing, all the drawbacks mentioned above for the direct screwing of the dispersion elements are also encountered.

A further drawback, common to all types described both of the first and of the second set of solutions wherein the dissipater is fastened directly to the board, is constituted by the fact that mounting said dissipaters requires the structural modification of the board, so that the dissipaters cannot be applied to existing integrated circuits mounted on boards lacking the appropriate holes or supports.

An alternative embodiment is described in the U.S. Pat. No. 6,093,961. In this case the heat dissipater is constituted solely by the dispersion element which inferiorly has appropriate appendages provided with pins that allow for their direct fastening to the integrated circuit.

The coupling can be either of the irreversible, pressure type, or of the reversible type. In this latter case the pins are located at the end of a lever that can be operated by a user in such a way that the pins are rotated about the fulcrum point of the lever, from an open position in which the dissipater can be mounted on the integrated circuit to a closed position in which the dissipater remains locked to the integrated circuit.

Although in this second case the pins are inclined in such a way as to press the dispersion element against the integrated circuit, with the embodiment described in the U.S. Pat. No. 6,093,961 it is not possible to obtain a pressure that is sufficiently uniform and constant over time between the dispersion element and the integrated circuit.

An additional embodiment is described in the U.S. Pat. No. 5,396,402 (FIGS. 6 through 8).

In this case the dissipater is constituted by a dispersion element whose dimensions substantially coincide with those of the upper part of the integrated circuit, and by means for coupling the dispersion element to the integrated circuit, means which in turn are constituted by two locking elements mounted on two opposite sides of the dispersion element.

Each locking element is pivotally engaged to the dispersion element by means of an appropriate coupling inserted between two tabs of the dispersion element itself, and it inferiorly has a pin able to be secured underneath the integrated circuit.

The locking element can rotate from a coupled position to an uncoupled position. Appropriate springs placed on a tab force the rotation of the locking element towards the coupled position.

The main drawbacks of this solution are, on one hand, the poor mechanical rigidity of the dissipater whose parts are not mutually fastened in a stable fashion, on the other hand the poor pressure that can be exerted with the spring. Due to the rotary motion, only a part of the force exerted by the spring can be exploit to exert a pressure between the dispersion element and the integrated circuit.

SUMMARY OF THE INVENTION

In this situation the technical task constituting the basis of the present invention is to obtain a heat dissipater for integrated circuits that is alternative with respect to prior art ones, and that overcomes the aforementioned drawbacks.

In particular, a technical task of the present invention is to obtain a heat dissipater for integrated circuits, that has a solid structure and guarantees a calibrated pressure of the dispersion element against the integrated circuit.

Another technical task of the present invention is to obtain a heat dissipater for integrated circuits that is easily mounted on an integrated circuit and equally easily removed therefrom.

A further technical task of the present invention is to obtain a heat dissipater for integrated circuits that guarantees an excellent heat dissipation and that may be associated to a cooling fan.

The specified technical task and the indicated aims are substantially achieved by a heat dissipater for integrated circuits, as described in the accompanying claims.

BRIEF DESCRIPTION OF THE DRAWINGS

Further characteristics and the advantages of the present invention shall become more readily apparent from the detailed description of a preferred, but not exclusive, embodiment of a heat dissipater for integrated circuits, illustrated in the accompanying drawings, in which:

FIG. 4 shows the dissipater of FIG. 3 associated with a device for its removal from the integrated circuit; and FIG. 5 shows a phase subsequent to that of FIG. 4.

DESCRIPTION OF THE PREFERRED EMBODIMENT

Figure 1:
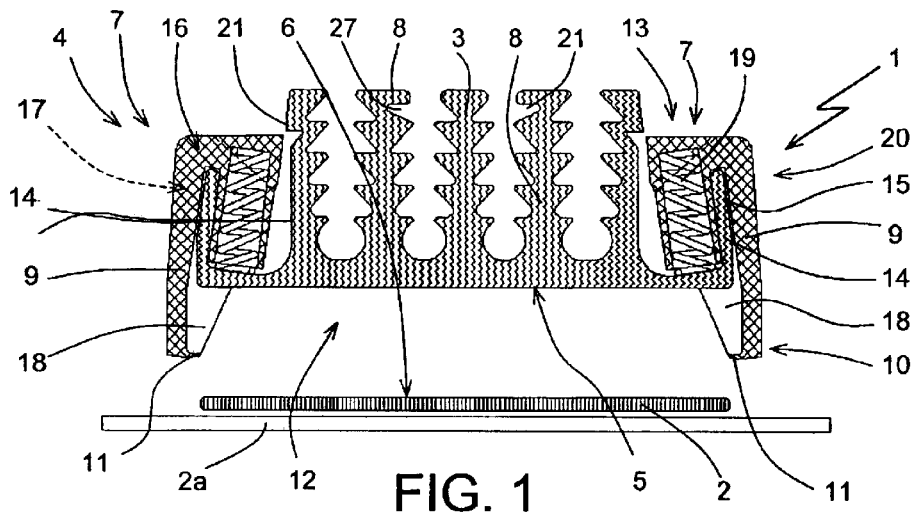
FIG. 1 shows a lateral section view of a heat dissipater according to the present invention during its insertion on an integrated circuit.

With reference to the aforesaid figures, the reference number 1 globally indicates a heat dissipater for integrated circuits 2 mounted on a board 2a, according to the present invention, which is constituted by a dispersion element 3 and by means 4 for securing the dispersion element 3 to the integrated circuit 2.

The dispersion element 3 has a planar lower base 5 that serves as a base surface, and that can be associated to an upper part 6 of an integrated circuit 2.

The Dispersion Element

The dispersion element 3 is made of a heat conductor material that can be metallic or non metallic.

In the illustrated embodiment the dispersion element 3 has a rectangular plan form, substantially corresponding to that of the integrated circuit 2, and it has two coupling sides 7, whereto are associated the securing means 4.

Advantageously then, in known ways, the dispersion element 3 has a plurality of cooling fins 8 that develop upwards from its upper face, and that can be variously shaped in such a way as to increase the dispersing surface.

To the upper part of the fins 8 can also be associated, in known ways, a cooling fan (not shown). Advantageously, however, to use larger fans it is opportune to associate them directly to the locking elements 9 in which appropriate seats (not shown herein) can be obtained for this purpose.

The securing means 4 comprise at least two locking elements 9 mounted mutually opposite on the dispersion element 3 in correspondence with the coupling sides 7.

Each locking element 9 develops around the related coupling side 7 and has, in its lower portion 10 positioned underneath the base surface, at least a latching pin 11 that extends towards the latching pin 11 of the other locking element 9. The locking elements 9 are mounted able to slide on the two coupling sides 7 of the dispersion element 3 according to their own direction of sliding, and they are movable relative to the dispersion element 3 itself from a lower position (FIGS. 1 and 2) to an upper position (FIG. 3).

Figure 2:
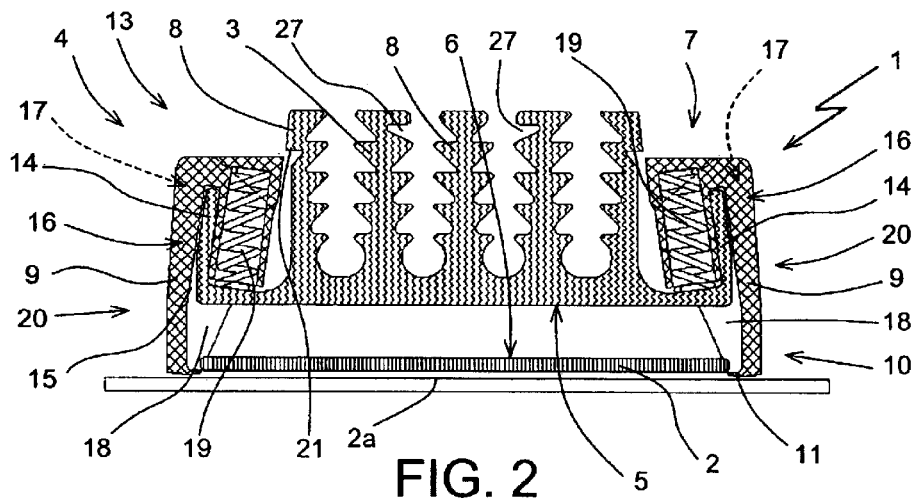
FIG. 2 shows the dissipater of FIG. 1 in a subsequent stage of insertion.
Figure 3:
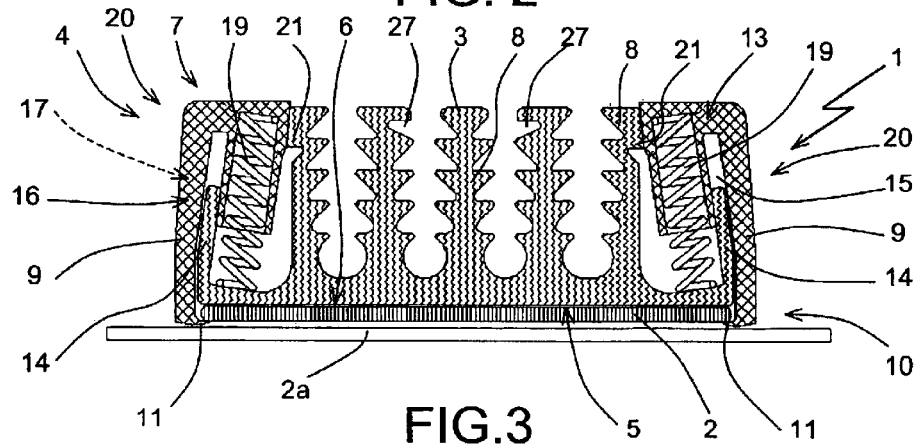
FIG. 3 shows the dissipater of FIG. 1 mounted on the integrated circuit.

When they are in the lower position the pins 11 are inferiorly distanced from the base 5 and between them they form such a passage 12 as to allow the coupling of the heat dissipater 1 on an integrated circuit 2 according to an direction of coupling with respect to the base surface (FIG. 2).

When instead they are in the upper position, the pins 11 are proximate to the base 5 and they are mutually approached with respect to when they are in the lower position. In this way they can lock the dissipater 1 on the integrated circuit 2 (FIG. 3).

Between the dispersion element 3 and each locking element 9 are interposed elastic means 13 operatively active on the locking element 9, to thrust it towards the upper position, and thus cause a calibrated pressure of the base 5 against the upper portion of the integrated circuit 2 (when the dissipater 1 is mounted on the integrated circuit 2).

In the embodiment illustrated in the accompanying figures, the locking elements 9 are movable along sliding planes that diverge below, and converge above the base surface.

This is obtained by means of two contoured appendages 14, which develop from the coupling sides 7 of the dispersion element 3 upwards according to the direction of sliding, to each of which appendages is associated, in sliding fashion, a seat 15 counter-shaped thereto, obtained in the locking element 9 associated to the related coupling side 7.

In other embodiments the appendages 14 can anyway be obtained on the locking elements 9, and the seats 15 on the dispersion element 3, without thereby departing from the scope of the present invention.

In the embodiment illustrated in the accompanying drawings, the locking elements 9 extend along the entire coupling side 7 from a first end 16 (in correspondence with which are obtained the section views shown in the accompanying figures) to a second end 17, in correspondence with which appropriate closure elements 18 (removable or otherwise) prevent their horizontal sliding relative to the dispersion element 3.

The elastic means 13 are operatively active on each locking element 9 at least in correspondence with the two ends 16, 17 thereof, in such a way as to exert a uniform pressure over the entire dispersion element 3.

In particular, in the illustrated embodiment, the elastic means 13 comprise four spiral springs 19 positioned at the four vertices 20 of the dispersion element 3. In other embodiments the springs can indifferently be of another kind (for instance leaf springs).

In the preferred embodiment, the dispersion element 3 also has at least two teeth 21 that allow to fasten the locking elements 9 in the lower position, to facilitate the mounting of the heat dissipater 1 on an integrated circuit 2. Each of said teeth 21 is integral to the cooling fin 8 that is closer to the related locking element 9, and they extend transversely to the direction of sliding. Advantageously, at least the fins 8 whereto the teeth 21 are associated are elastically deformable. Said deformation causes the related tooth 21 to move from a position of interference (under resting conditions) in which it can lock the respective locking element 9, to a position of non interference (under a condition of obligated inward flexure of the dispersion element 3) in which it does not hamper the movement of the locking element 9.

Preferably the elasticity of the fin 8 whereto the tooth 21 is associated derives simply from the elongated shape of the fin and from the characteristics of the material whereof it is made.

With respect to the embodiment described so far, many variations can be provided, such as a plurality of locking elements 9 that can be positioned either on the same coupling sides 7 indicated above, or on the other sides of the dispersion element 3.

The mounting of the heat dissipater 1 on the integrated circuit 2 takes place with the locking elements 9 held in the lower position of the appropriate teeth 21. In this situation the pins 11 are distanced and allow the insertion of the integrated circuit 2 between them.

Depending on design parameters, the insertion can take place either by making the integrated circuit 2 simultaneously pass between both pins 11, as shown in FIG. 2, or inserting first a pin 11 and then the other one.

At this point the teeth 21 are placed in the position of non interference and the elastic means 13 cause the locking elements 19 to snap into the upper position, so that the pins 11 lock the dissipater 1 on the integrated circuit 2.

Advantageously in any case, between the dispersion element 3 and the integrated circuit 2 can be interposed an appropriate conducting paste in order to enhance heat exchange between the two.

To remove the dissipater 1 it is sufficient first of all to bring the locking elements 9 back to the lower position, locking them with the teeth 21, then to extract the dissipater 1.

For this purpose, one can for instance use the device 22 shown in FIGS. 4 and 5, constituted by a support structure 23 that bears on the locking elements 9 and by a part 24 able to move vertically relative to the support structure 23 and provided at its own lower end 25 with appropriate hooks 26 that are inserted in housings 27 obtained in the dispersion element 3.

Lifting movable part 24 upwards with the support structure 23 motionless, one can easily bring the dissipater 1 back to the initial condition.

In the illustrated embodiment the movable part 24 comprises a screw (not shown herein) that is operated by means of a knob 28.

Alternatively, electromechanical or pneumatic extractors can be used.

The present invention achieves important advantages.

In the first place the heat dissipater for integrated circuits of the present invention is structurally sound and allows to have a calibrated pressure of the dispersion element against the integrated circuit, which depends solely on the design of the elastic means.

Moreover, it is able completely to cover the upper surface of the integrated circuit, and thereby allows a uniform cooling thereof.

In the second place, the heat dissipater of the present invention in addition to being easily mounted on an integrated circuit can also be easily removed therefrom, and said operations can also be automated without any problems. Suffice it to consider that to couple the dissipater it is sufficient to position it on the integrated circuit and to free the locking elements from the grip of the teeth. Additionally, the dissipater of the present invention does not need any adaptations of the board or of the integrated circuit to be applied, and hence can be mounted both on new integrated circuits as they are manufactured, and on integrated circuits already in use instead of others.

It should also be noted that the present invention is relatively easy to realise and that the cost connected to the implementation of the invention is not very high relative to the standards of the industry.

The invention thus conceived can be subject to numerous modifications and variations, without thereby departing from the scope of the inventive concept that characterises it.

All components can be replaced by other technically equivalent elements and in practice all materials used, as well as the shapes and dimensions of the various components, can be any depending on requirements.

What is claimed:

1. Heat dissipater for integrated circuits comprising a dispersion element having a planar lower base serving as a base surface, and able to be associated to an upper part of an integrated circuit, means for securing said dispersion element to said integrated circuit, comprising at least two locking elements mounted on said dispersion element in mutually opposite positions, and presenting each, in its lower portion, at least a latching pin developing towards the latching pin of the other locking element, and elastic means operatively active on said locking elements, characterised in that said locking elements are mounted in sliding fashion on said dispersion element according to a sliding direction, and are movable relative to the dispersion element itself from a lower position in which said pins are inferiorly distanced from said base and form between them a passage for the coupling of said heat dissipater on an integrated circuit according to a coupling direction that is incident relative to said base surface, to an upper position in which said pins are proximate to said base and are mutually approached with respect to when they are in said lower position to lock said dispersion element on said integrated circuit, and in that said elastic means are mounted between said dispersion element and said locking elements, and are operatively active on said locking element to thrust them towards the upper position, and to cause a calibrated pressure of said base against the upper portion of said integrated circuit when the dispersion element is mounted on the integrated circuit itself.

2. Heat dissipater as claimed in claim 1 characterised in that said locking elements are movable along two sliding planes diverging below, and converging above said base surface.

3. Heat dissipater as claimed in claim 2 characterised in that the dispersion element has rectangular plan form and in that said locking elements are associated to two mutually opposite coupling sides of said dispersion element.

4. Heat dissipater as claimed in claim 3 characterised in that said dispersion element comprises at least two contoured appendages developing upwards according to the direction of sliding of said locking elements, and positioned in correspondence with said coupling sides, and in that each locking element also has a seat that is shaped counter to one of said appendages, in which one of said appendages is inserted in sliding fashion.

5. Heat dissipater as claimed in claim 4 characterised in that said locking elements extend along the entire coupling side from a first to a second end, and in that said elastic means are operatively active on each locking element at least in correspondence with both ends, thereof.

6. Heat dissipater as claimed in claim 1 characterised in that the dispersion element has rectangular plan form and in that said locking elements are associated to two mutually opposite coupling sides of said dispersion element.

7. Heat dissipater as claimed in claim 6 characterised in that said dispersion element comprises at least two contoured appendages developing upwards according to the direction of sliding of said locking elements, and positioned in correspondence with said coupling sides, and in that each locking element also has a seat that is shaped counter to one of said appendages, in which one of said appendages is inserted in sliding fashion.

8. Heat dissipater as claimed in claim 7 characterised in that said locking elements extend along the entire coupling side from a first to a second end, and in that said elastic means are operatively active on each locking element at least in correspondence with both ends, thereof.

9. Heat dissipater as claimed in claim 1 characterised in that said dispersion element has a plurality of cooling fins developing upwards.

10. Heat dissipater as claimed in claim 1 characterised in that said dispersion element also has at least two teeth extending transversely to the direction of sliding and operatively active each on one of the locking elements to hold the locking element in the lower position.

11. Heat dissipater as claimed in claim 10 characterised in that each tooth is fastened to an elastically deformable part of said dispersion element, the deformation of said part causing the movement of the related tooth from a position of interference in which it can lock the respective locking element to a position of non interference in which it does not hamper the movement of the locking element.

12. Heat dissipater as claimed claim 2 characterised in that said dispersion element also has at least two teeth extending transversely to the direction of sliding and operatively active each on one of the locking elements to hold the locking element in the lower position.

13. Heat dissipater as claimed in claim 12 characterised in that each tooth is fastened to an elastically deformable part of said dispersion element, the deformation of said part causing the movement of the related tooth from a position of interference in which it can lock the respective locking element to a position of non interference in which it does not hamper the movement of the locking element.

14. Heat dissipater as claimed claim 3 characterised in that said dispersion element also has at least two teeth extending transversely to the direction of sliding and operatively active each on one of the locking elements to hold the locking element in the lower position.

15. Heat dissipater as claimed in claim 14 characterised in that each tooth is fastened to an elastically deformable part of said dispersion element, the deformation of said part causing the movement of the related tooth from a position of interference in which it can lock the respective locking element to a position of non interference in which it does not hamper the movement of the locking element.

16. Heat dissipater as claimed claim 4 characterised in that said dispersion element also has at least two teeth extending transversely to the direction of sliding and operatively active each on one of the locking elements to hold the locking element in the lower position.

17. Heat dissipater as claimed in claim 16 characterised in that each tooth is fastened to an elastically deformable part of said dispersion element, the deformation of said part causing the movement of the related tooth from a position of interference in which it can lock the respective locking element to a position of non interference in which it does not hamper the movement of the locking element.

18. Heat dissipater as claimed claim 5 characterised in that said dispersion element also has at least two teeth extending transversely to the direction of sliding and operatively active each on one of the locking elements to hold the locking element in the lower position.

19. Heat dissipater as claimed in claim 18 characterised in that each tooth is fastened to an elastically deformable part of said dispersion element, the deformation of said part causing the movement of the related tooth from a position of interference in which it can lock the respective locking element to a position of non interference in which it does not hamper the movement of the locking element.

20. Heat dissipater as claimed claim 6 characterised in that said dispersion element also has at least two teeth extending transversely to the direction of sliding and operatively active each on one of the locking elements to hold the locking element in the lower position.

21. Heat dissipater as claimed in claim 20 characterised in that each tooth is fastened to an elastically deformable part of said dispersion element, the deformation of said part causing the movement of the related tooth from a position of interference in which it can lock the respective locking element to a position of non interference in which it does not hamper the movement of the locking element.

* * * * *